US012704791B2

(12) United States Patent
Goichman et al.

(10) Patent No.: US 12,704,791 B2
(45) Date of Patent: Aug. 11, 2026

(54) VERTICAL MOTION AXIS FOR IMAGING OPTICAL HEAD

(71) Applicant: Orbotech Ltd., Yavne (IL)

(72) Inventors: Tal Goichman, Kiryat Ono (IL); Ashkan Aghajani, Yavne (IL); Arkady Bronfman, Yavne (IL)

(73) Assignee: Orbotech Ltd., Yavne (IL)

(*) Notice: Subject to any disclaimer, the term of this patent is extended or adjusted under 35 U.S.C. 154(b) by 0 days.

(21) Appl. No.: 17/990,162

(22) Filed: Nov. 18, 2022

(65) Prior Publication Data

US 2024/0168395 A1 May 23, 2024

(51) Int. Cl.
*G03F 7/00* (2006.01)

(52) U.S. Cl.
CPC ...... *G03F 7/70758* (2013.01); *G03F 7/70766* (2013.01); *G03F 7/70775* (2013.01)

(58) Field of Classification Search
CPC ............. G03F 7/70758; G03F 7/70766; G03F 7/70775; G03F 7/70783; G03F 7/70791; G03F 7/708; G03F 7/70808; G03F 7/70816; G03F 7/70825; G03F 7/70833; G03F 7/70841; G03F 7/709; G03F 7/70858; G03F 7/70991; G03F 7/70975; G03F 7/70483; G03F 7/705; G03F 7/7085; G03F 7/70605–70675; G03F 7/706843–706851; F16C 39/00; F16C 39/06; F16C 39/063; F16C 39/066;
(Continued)

(56) References Cited

U.S. PATENT DOCUMENTS 6,831,285 B2 12/2004 Hol et al.
8,854,603 B2 10/2014 Muehlberger et al.
9,172,291 B2 10/2015 Cardon
(Continued)

FOREIGN PATENT DOCUMENTS

CN 111133385 A 5/2020
CN 111356956 A 6/2020
(Continued)

OTHER PUBLICATIONS https://stevenengineering.com/Tech_Support/PDFs/LINMOT_MAGSPRING-MAGNETIC-SPRINGS.pdf.
(Continued)

*Primary Examiner* — Christina A Riddle
(74) *Attorney, Agent, or Firm* — Suiter Swantz IP

(57) ABSTRACT

A translation stage may include a first plate and a second plate moveable with respect to the first plate along a vertical direction. The stage may also include one or more magnetic counterbalances opposing the weight of the second plate, where at least one of the one or more magnetic counterbalances comprises a tunable magnetic counterbalance. A tunable magnetic counterbalance may include a first portion including one or more magnets and a second portion including one or more ferromagnetic materials, where the one or more ferromagnetic materials at least partially surround the one or more magnets in a horizontal plane. The counterbalance force may be adjustable by controlling at least one of a relative rotation angle between the first and second portions in the horizontal plane or a length of the gap along at least one direction. The stage may also include an actuator to position the second plate.

33 Claims, 13 Drawing Sheets

(58) Field of Classification Search
CPC ......... F16F 15/28; F16F 15/03; H01F 7/0236; H01F 7/0268
USPC ............................. 355/18, 30, 52–55, 67–77
See application file for complete search history.

(56) References Cited

U.S. PATENT DOCUMENTS

| | | | | |
|---|---|---|---|---|
| 9,519,230 | B2 | 12/2016 | Boon et al. | |
| 10,415,639 | B2 | 9/2019 | Ji et al. | |
| 2004/0135468 | A1* | 7/2004 | De Weerdt | G03F 7/70758 310/311 |
| 2006/0061219 | A1* | 3/2006 | Hazelton | G03F 7/70816 310/12.06 |
| 2009/0028683 | A1* | 1/2009 | Zywno | H01J 37/3174 414/754 |
| 2013/0293889 | A1* | 11/2013 | Emoto | G01B 11/27 355/27 |
| 2015/0009557 | A1 | 1/2015 | Muehlberger et al. | |
| 2017/0153186 | A1* | 6/2017 | Jeanne | H01L 22/12 |
| 2019/0204590 | A1 | 7/2019 | Ramalho et al. | |
| 2020/0159131 | A1* | 5/2020 | Erath | F16C 32/0434 |
| 2020/0218059 | A1 | 7/2020 | Kuiper | |
| 2020/0332857 | A1* | 10/2020 | Lo | F16F 15/36 |
| 2021/0373446 | A1 | 12/2021 | Huang et al. | |

FOREIGN PATENT DOCUMENTS

| | | | |
|---|---|---|---|
| DE | 102010027954 | A1 | 10/2011 |
| DE | 102011088735 | A1 | 6/2012 |
| DE | 102013204317 | A1 | 3/2014 |
| DE | 102015201255 | A1 | 3/2016 |
| DE | 102016226085 | A1 | 3/2017 |
| EP | 2235722 | B1 | 8/2018 |
| JP | 2011192889 | A | 9/2011 |
| JP | 5612595 | B2 | 10/2014 |
| WO | 2018166745 | A1 | 9/2018 |

OTHER PUBLICATIONS https://www.magneticinnovations.com/wp-content/uploads/2016/11/Magnetic-Gravity-Compensator-MI-MGC-Series-Datasheet.pdf.

Janssen, et al. “Passive limitations for a magnetic gravity compensator.” Journal of System Design and Dynamics 3 (2009): 671-680.

Janssen, et al., Design study on a magnetic gravity compensator with unequal magnet arrays, Mechatronics, vol. 23, Issue 2, 2013, pp. 197-203, ISSN 0957-4158, https://doi.org/10.1016/j.mechatronics.2012.08.003.

Zhou, Yiheng et al. “Force characteristic analysis of a magnetic gravity compensator with annular magnet array for magnetic levitation positioning system.” AIP Advances 8 (2018): 056706.

Israel Patent Office, International Search Report and Written Opinion received in International Application No. PCT/IL2023/051136, Feb. 12, 2024, 9 pages.

China National Intellectual Property Administration, Office Action received in CN Application No. 202380044289.4, Aug. 9, 2025, 24 pages (including translation).

* cited by examiner 208-9
204
208-7
208-8
S
N
S
N
124
124
202
208-10
204
606
202
X
Y 202
206
206
S
N
S
N
208-5
208-6
204
604
124
X
Y

VERTICAL MOTION AXIS FOR IMAGING OPTICAL HEAD

TECHNICAL FIELD

The present disclosure relates generally to a head assembly for metrology systems and, more particularly, to a head assembly with a magnetic counterbalance.

BACKGROUND

Metrology systems providing optical imaging of a sample typically require precise control of a distance between a sample and imaging optics such as an objective lens, which may be along an optical axis of the metrology system. For example, this distance may be related to a focal height and/or depth of focus for a particular application. Further, many applications require sample movement in a plane lateral to the optical axis. As a result, the imaging optics and/or the sample may need to be adjusted to maintain a desired distance between the sample and the imaging optics. However, such adjustments may be challenging in cases involving the motion of heavy masses and/or high tracking frequencies. There is therefore a need to develop systems and methods to address the above deficiencies.

SUMMARY

A translation stage is disclosed in accordance with one or more illustrative embodiments of the present disclosure. In one illustrative embodiment, the stage includes a first plate. In another illustrative embodiment, the stage includes a second plate, where the second plate is moveable with respect to the first plate along a vertical direction associated with a weight of the second plate. In another illustrative embodiment, the stage includes one or more magnetic counterbalances coupled to the first and second plates, providing a counterbalance force to the second plate in the vertical direction opposing the weight of the second plate, where at least one of the one or more magnetic counterbalances comprises a tunable magnetic counterbalance. In another illustrative embodiment, a tunable magnetic counterbalance includes a first portion including one or more magnets, the first portion attached to one of the first plate or the second plate. In another illustrative embodiment, the tunable magnetic counterbalance includes a second portion including one or more ferromagnetic materials, where the second portion is attached to a different one of the first plate or the second plate than the first portion. In another illustrative embodiment, the one or more ferromagnetic materials at least partially surround the one or more magnets in a horizontal plane orthogonal to the vertical direction. In another illustrative embodiment, the first and second portions are separated by a gap. In another illustrative embodiment, the counterbalance force is adjustable by controlling at least one of a relative rotation angle between the first and second portions in the horizontal plane or a length of the gap along at least one direction. In another illustrative embodiment, the system includes an actuator configured to position the second plate with respect to the first plate along the vertical direction.

A system is disclosed in accordance with one or more illustrative embodiments of the present disclosure. In one illustrative embodiment, the system includes a first plate. In another illustrative embodiment, the system includes a second plate, where the second plate is moveable with respect to the first plate along a vertical direction associated with a weight of the second plate. In another illustrative embodiment, the second plate is configured to connect to one or more objects. In another illustrative embodiment, the system includes one or more magnetic counterbalances coupled to the first and second plates, providing a counterbalance force to the second plate in the vertical direction opposing the weight of the second plate. In another illustrative embodiment, at least one of the one or more magnetic counterbalances includes a tunable magnetic counterbalance. In another illustrative embodiment, a tunable magnetic counterbalance includes a first portion including one or more magnets, where the first portion is attached to one of the first plate or the second plate. In another illustrative embodiment, the tunable magnetic counterbalance includes a second portion including one or more ferromagnetic materials, where the second portion is attached to a different one of the first plate or the second plate than the first portion. In another illustrative embodiment, the one or more ferromagnetic materials at least partially surround the one or more magnets in a horizontal plane orthogonal to the vertical direction. In another illustrative embodiment, the first and second portions are separated by a gap. In another illustrative embodiment, the counterbalance force is adjustable by controlling at least one of a relative rotation angle between the first and second portions in the horizontal plane or a size of the gap along at least one direction. In another illustrative embodiment, the system includes a translation stage for positioning a sample in at least the horizontal plane. In another illustrative embodiment, the system includes an actuator configured to position the second plate with respect to the first plate along the vertical direction. In another illustrative embodiment, the system includes a controller to direct, via one or more drive signals, the actuator to provide a selected distance in the vertical direction between the sample and one of the one or more objects on the second plate.

A method is disclosed in accordance with one or more illustrative embodiments of the present disclosure. In one illustrative embodiment, the method includes placing a sample at a selected distance in a vertical direction from one of one or more objects, where the object is connected to a translation stage. In another illustrative embodiment, the translation stage includes a first plate. In another illustrative embodiment, the stage includes a second plate, where the second plate is moveable with respect to the first plate along the vertical direction, and where the vertical direction is associated with a weight of the second plate. In one illustrative embodiment, one or more objects are connected to the second plate. In another illustrative embodiment, the stage includes one or more magnetic counterbalances coupled to the first and second plates, providing a counterbalance force to the second plate in the vertical direction opposing the weight of the second plate, where at least one of the one or more magnetic counterbalances comprises a tunable magnetic counterbalance, wherein the tunable magnetic counterbalance includes a first portion including one or more magnets, where the first portion is attached to one of the first plate or the second plate. In another illustrative embodiment, the tunable magnetic counterbalance includes a second portion including one or more ferromagnetic materials, where the second portion is attached to a different one of the first plate or the second plate than the first portion. In another illustrative embodiment, the one or more ferromagnetic materials at least partially surround the one or more magnets in a horizontal plane orthogonal to the vertical direction. In another illustrative embodiment, the first and second portions are separated by a gap. In another illustrative embodiment, the counterbalance force is adjustable by controlling at least one of a relative rotation angle between the first and second portions in the horizontal plane or a size of the gap along at least one direction. In another illustrative embodiment, the stage includes an actuator configured to position the second plate with respect to the first plate along the vertical direction. In another illustrative embodiment, the method includes adjusting the counterbalance force to be equal to a combined weight of the second plate and the one or more objects. In another illustrative embodiment, the method includes generating measurements of at least one of position of the sample along the vertical direction or a distance in the vertical direction between the sample and the at least one of the one or more objects on the second plate. In another illustrative embodiment, the method includes maintaining, via the actuator, the selected distance in the vertical direction between the sample and the one of one or more objects based on the measurements.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1A:
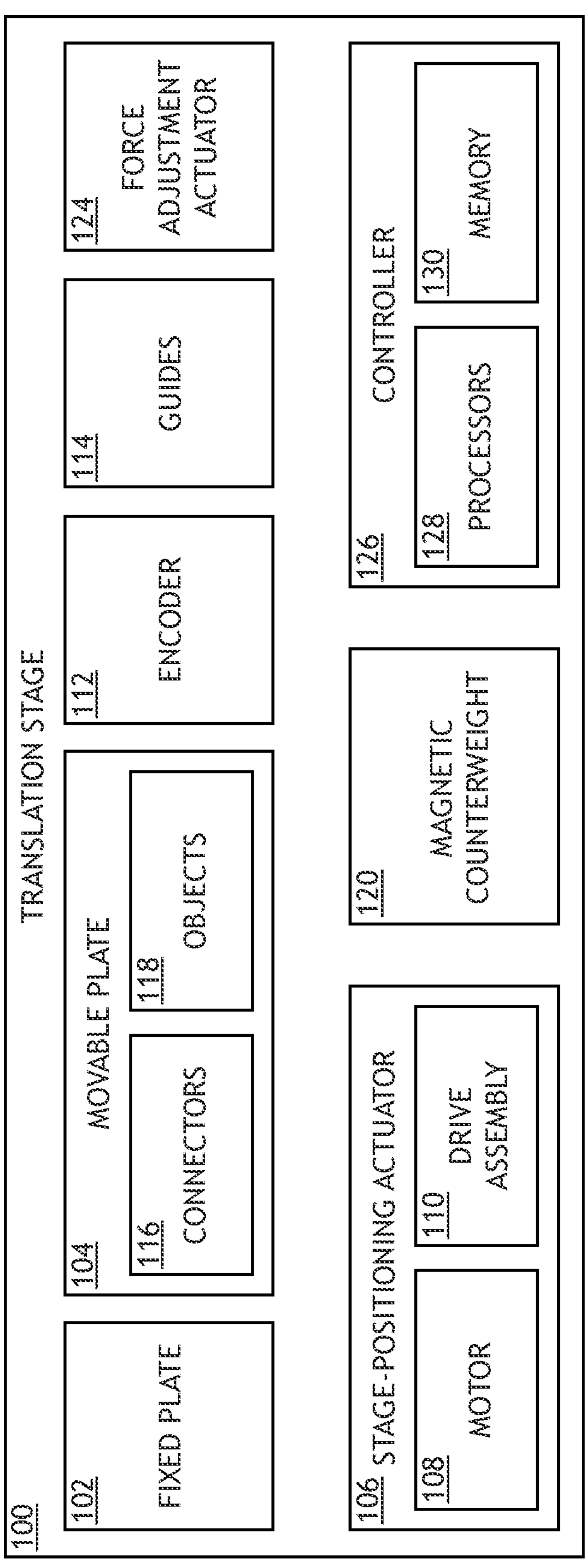
FIG. 1A is a block diagram view of a translation stage, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for providing an adjustable counterbalance for a translation stage oriented in a vertical direction such that a counterbalance force opposes the weight of a movable element of the translation stage. As used herein, the term vertical direction is used to refer to a direction associated with a weight of an object (e.g., a direction of gravity).

In some embodiments, a translation stage includes two plates that are movable with respect to each other and an actuator to control the relative positions of the two plates (e.g., a stage-positioning actuator). For example, a translation stage having a first plate and a second plate may have a second plate that is moveable with respect to the first plate. For instance, the first plate may be fixed to a table or other support structure, while the second plate may include objects to be positioned.

In the case of a linear translation stage oriented to provide linear motion in a vertical direction, the stage-positioning actuator must typically bear the weight of movable plate (e.g., the second plate) and any objects thereon, which may induce excessive heat and increase the demands of the stage-positioning actuator. For the purposes of the present disclosure, the term load is used to refer to a moveable plate of a translation stage and any objects attached to the moveable plate. Further, the term load weight is used to refer to a weight of such a load. For example, the size and load requirements of the stage-positioning actuator must typically be sufficient to fully support the load weight for a vertical translation stage. As an illustration, a stage-positioning actuator formed as a lead screw attached to an electric motor may require a substantial amount of motor power to simply counteract the load weight, which may result in substantial heat generation and require a suitably sized motor and associated components. Additionally, such a configuration may suffer with relatively high inertia, low acceleration, substantial friction, and a variable pitch.

To mitigate strain on the actuator in a vertical configuration, a counterbalance may be used to at least partially counteract the load weight and thus reduce or eliminate the need for the stage-positioning actuator to support the load weight. As a result, the size and load requirements of the stage-positioning actuator may be similar to that required for a translation stage configured for horizontal motion.

In some embodiments, a translation stage includes one or more magnetic counterbalances to at least partially counteract the weight of a moveable plate and any mounted components.

In some embodiments, a magnetic counterbalance is formed as two portions configured to move with respect to each other along a direction of motion (e.g., a vertical direction), where a first portion includes one or more magnets and a second portion includes one or more ferromagnetic materials arranged to at least partially surround the one or more magnets in a plane orthogonal to the direction of motion (e.g., a horizontal plane). As one illustrative example, the first portion may be formed as a rod and the second portion may be formed as a ferromagnetic sleeve that may at least partially surround the rod. Further, the first and second portions of the magnetic counterbalance may be connected to the fixed and moveable plates of a translation stage. In a general sense, either portion of the magnetic counterbalance may be attached to either the moveable plate or the fixed plate of a translation stage.

In this configuration, a magnetic attractive force between the first and second portions may vary based on their relative positions along the direction of motion. In particular, this force may be constant (or substantially constant) over an operational range (e.g., a stroke length) as the first and second portions are deviated from an equilibrium position. In some embodiments, a translation stage includes one or more magnetic counterbalances oriented such that this magnetic attractive force operates as a counterbalance force that opposes the load weight associated with the moveable plate and any connected objects. Accordingly, the operational range of the magnetic counterbalance may define a range of motion of the translation stage.

In some embodiments, a magnetic counterbalance as disclosed herein is formed with a gap (e.g., an air gap) between the first and second portions to prevent friction between the first and second portions and in turn avoid hysteresis. This gap may be uniform in all directions within the plane (e.g., the horizontal plane) or non-uniform.

In some embodiments, a translation stage includes at least one magnetic counterbalance providing a tunable counterbalance force. Such a magnetic counterbalance is referred to herein as a tunable magnetic counterbalance. It is contemplated herein that a tunable magnetic counterbalance may be used to tune the counterbalancing force to precisely offset the load weight. As a result, a stage-positioning actuator may adjust a position of the moveable plate within the operational range of the magnetic counterbalance without bearing the load weight.

A counterbalance force of a tunable magnetic counterbalance may be tuned using a variety of techniques within the spirit and scope of the present disclosure. In some embodiments, the counterbalance force is tuned by adjusting a relative rotation angle between the first and second portions (e.g., a relative rotation angle between the one or more magnets and the one or more ferromagnetic materials). For example, the first portion of a magnetic counterbalance may include at least one magnet arranged with a magnetic polarization direction in a horizontal plane and the second portion may include an asymmetric distribution of ferromagnetic material such that the counterbalance force may vary as a function of the relative rotation angle between the first and second portions. In some embodiments, the counterbalance force is tuned by adjusting a gap distance between the first and second portions of the magnetic counterbalance. For example, the ferromagnetic sleeve may be formed as two or more adjustable sections whose positions relative to the magnet may be adjusted with one or more actuators.

It is contemplated herein that magnetic counterbalances may be well suited for counterbalancing a load weight of a vertical translation state. For example, a magnetic counterbalance may provide a constant (or substantially constant) force over an operational range in a manner that does not introduce any friction and thus avoids hysteresis. As another example, a magnetic counterbalance may provide near-zero stiffness and may thus avoid resonances (e.g., a local spring/mass type resonance). As another example, a magnetic counterbalance may be relatively low cost and have high reliability. For instance, the operation of the counterbalance does not require the application of any power. As a result, magnetic counterbalances may enable high-precision control of the vertical position of a moveable plate and connected objects with fast tracking rates (e.g., 5-10 Hz or higher) for a wide range of load weights.

It is further contemplated herein that magnetic counterbalances may provide various advantages over alternative counterbalancing techniques due at least in part to these benefits. For example, a counterbalance mass may double the inertia of the system, which may limit tracking speeds, acceleration, and/or precision. As another example, a preload spring providing a counterbalance force may suffer from parasitic resonances. Further, this configuration only fully offsets the load weight at a single position such that a linear actuator must bear an increasing portion of the load weight as the position of the moveable platform deviates from this position. As another example, an air cylinder may require tight control over the air pressure and temperature to maintain performance. Further an air cylinder may suffer from friction, which may negatively impact the precision of motion.

Additional embodiments of the present disclosure are directed to a system including a vertical translation stage having one or more magnetic counterbalances. For example, the system may include one or more objects on the moveable plate. In this way, the magnetic counterbalances may counteract the weight of the moveable plate as well as the objects. The position of these objects may then be controlled (e.g., with respect to a sample) using one or more actuators. In some embodiments, objects include at least a lens such that a working distance between the lens and the sample may be controlled based on a position of the moveable plate.

In some embodiments, the system is an optical system. For example, a system may include one or more optical components (e.g., one or more lenses, one or more mirrors, one or more detectors, one or more illumination sources, or the like) attached to a moveable plate of a translation stage as disclosed herein. In this configuration, a relative position between a sample and at least one of the optical components may be controlled based on a position of the moveable plate. As an illustration in the case of an imaging system, one or more lenses may be connected to a moveable plate such that a working distance between the lenses and the sample may be controlled based on a position of the moveable plate. Further, one or more additional components such as, but not limited to, detectors or illumination sources (e.g., laser sources, light-emitting diodes (LEDs), or any other light sources suitable for imaging) may be connected to the moveable plate. As another illustration, a system including an optical head with optical components suitable for illumination of a sample with light and/or collecting light from the sample may be configured to have at least a portion of the optical head connected to a moveable plate of a translation stage as disclosed herein. The optical head may include any type of optical head known in the art suitable for any application. For instance, the optical head may include components suitable for, but not limited to, imaging (e.g., laser imaging, broadband imaging, or the like), or reading. In some embodiments, the optical system includes an optical metrology system, where at least some components for illuminating a sample or collecting light from a sample are connected to the moveable plate.

Referring now to FIGS. 1A-8, systems and methods for providing an adjustable counterbalance for a translation stage oriented in a vertical direction are described in greater detail, in accordance with one or more embodiments of the present disclosure.

Figure 1B:
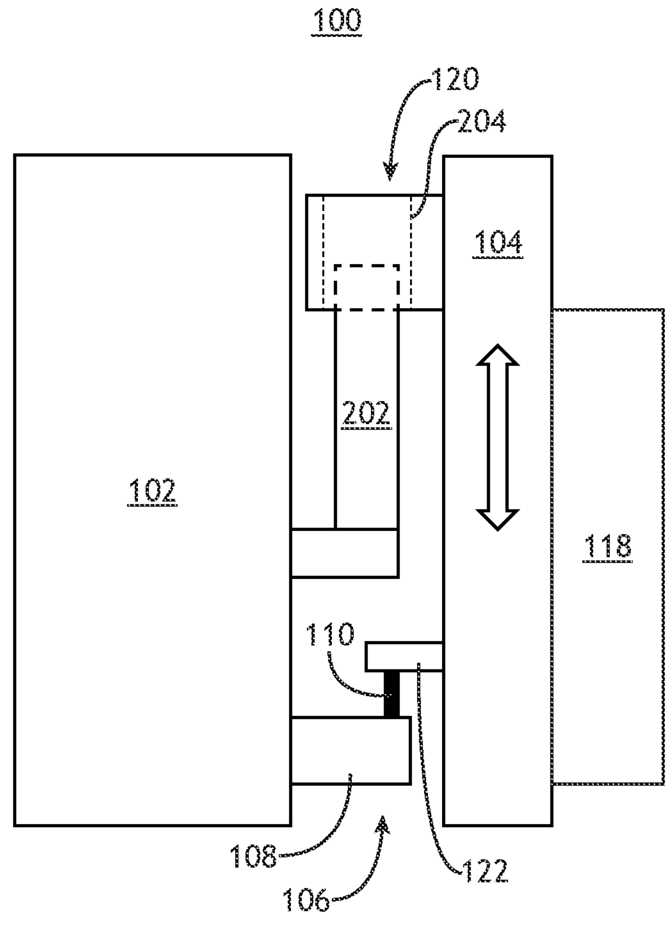
FIG. 1B is a simplified schematic of a translation stage, in accordance with one or more embodiments of the present disclosure.
Figure 1B:
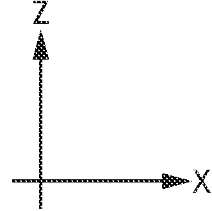

FIG. 1A is a block diagram view of a translation stage 100, in accordance with one or more embodiments of the present disclosure. FIG. 1B is a simplified schematic of a translation stage 100, in accordance with one or more embodiments of the present disclosure.

In some embodiments, the translation stage 100 includes a fixed plate 102, a moveable plate 104 (e.g., first and second plates), and at least one stage-positioning actuator 106 (e.g., a linear actuator) to adjust a position of the moveable plate 104 relative to the fixed plate 102 in at least one translation direction.

For example, a translation stage 100 configured for one-directional (1D) motion along a single translation direction may include a single stage-positioning actuator 106. Two-directional (2D) motion may be achieved using various techniques. For example, two 1D translation stages 100 may be coupled to provide 2D motion. As an illustration, a fixed plate 102 of a first translation stage 100 may be mounted to a moveable plate 104 of a second translation stage 100. As another example, a single translation stage 100 may include two stage-positioning actuators 106 configured to adjust positions of the moveable plate 104 along two directions.

The translation stage 100 may include any type of stage-positioning actuator 106 known in the art. For example, the stage-positioning actuator 106 may include a motor 108 coupled to a drive assembly 110 such as, but not limited to, bearings (e.g., mechanical bearings, air bearings, magnetic bearings, or the like), gears, belts, screws, or pins. As an illustration, FIG. 1B depicts a stage-positioning actuator 106 with a motor 108 coupled to the fixed plate 102 and a drive assembly 110 contacting and/or coupled with the moveable plate 104. In some embodiments, the stage-positioning actuator 106 includes a direct-drive linear actuator (e.g., a direct-drive motor) such as, but not limited to, a magnetic actuator or a piezoelectric actuator. In some embodiments, the stage-positioning actuator 106 includes a voice-coil actuator.

In some embodiments, the translation stage 100 includes one or more encoders 112 to provide measurements of a relative position of the moveable plate 104 with respect to the fixed plate 102. The translation stage 100 may include any type of encoder 112 known in the art including, but not limited to, an optical encoder 112, a capacitive encoder 112, an inductive encoder 112, or a magnetic encoder 112. In this way, measurements provided by an encoder 112 may be used as feedback to the stage-positioning actuator 106 for controlling the relative position of the moveable plate 104. Such a stage-positioning actuator 106 may utilize any type of control technique for controlling the relative position of the moveable plate 104 including, but not limited to, a proportional-integral-derivative (PID) technique.

In some embodiments, the translation stage 100 includes one or more guides 114 (e.g., linear guides) to constrain the motion of the moveable plate 104 with respect to the fixed plate 102 such as, but not limited to, rails or bearings (e.g., mechanical bearings, air bearings, magnetic bearings, or the like). For example, a translation stage 100 suitable for 1D linear motion may include a guide formed as a linear rail, where the fixed plate 102 and/or the moveable plate 104 are connected to the rail via one or more bearings.

In some embodiments, at least the moveable plate 104 includes one or more connectors 116 suitable for connecting with and/or securing objects 118 to be translated. For example, the connectors 116 may include one or more tapped or untapped holes suitable for establishing connections with objects 118 to be translated. As another example, the connectors 116 may include clamps or other fastening devices to secure objects 118 to be translated.

In some embodiments, a translation stage 100 with a moveable plate 104 suitable for motion along a vertical direction may include one or more magnetic counterbalances 120 designed to provide a counterbalance force that at least partially counteracts the weight of the moveable plate 104 and any connected objects 118 (e.g., a load weight). As a result, the size and load requirements of the stage-positioning actuator 106 may be substantially reduced relative to configurations in which it must bear the weight of the moveable plate 104 and any attached objects 118.

A translation stage 100 may generally include any number of magnetic counterbalances 120, where the magnetic counterbalances 120 may be distributed in any distribution and may provide the same or different counterbalance forces.

In some embodiments, a translation stage 100 includes a single magnetic counterbalance 120 to counter the weight of the moveable plate 104 and any attached objects 118. In this configuration, the single magnetic counterbalance 120 may counter the entire load weight.

Figure 1C:
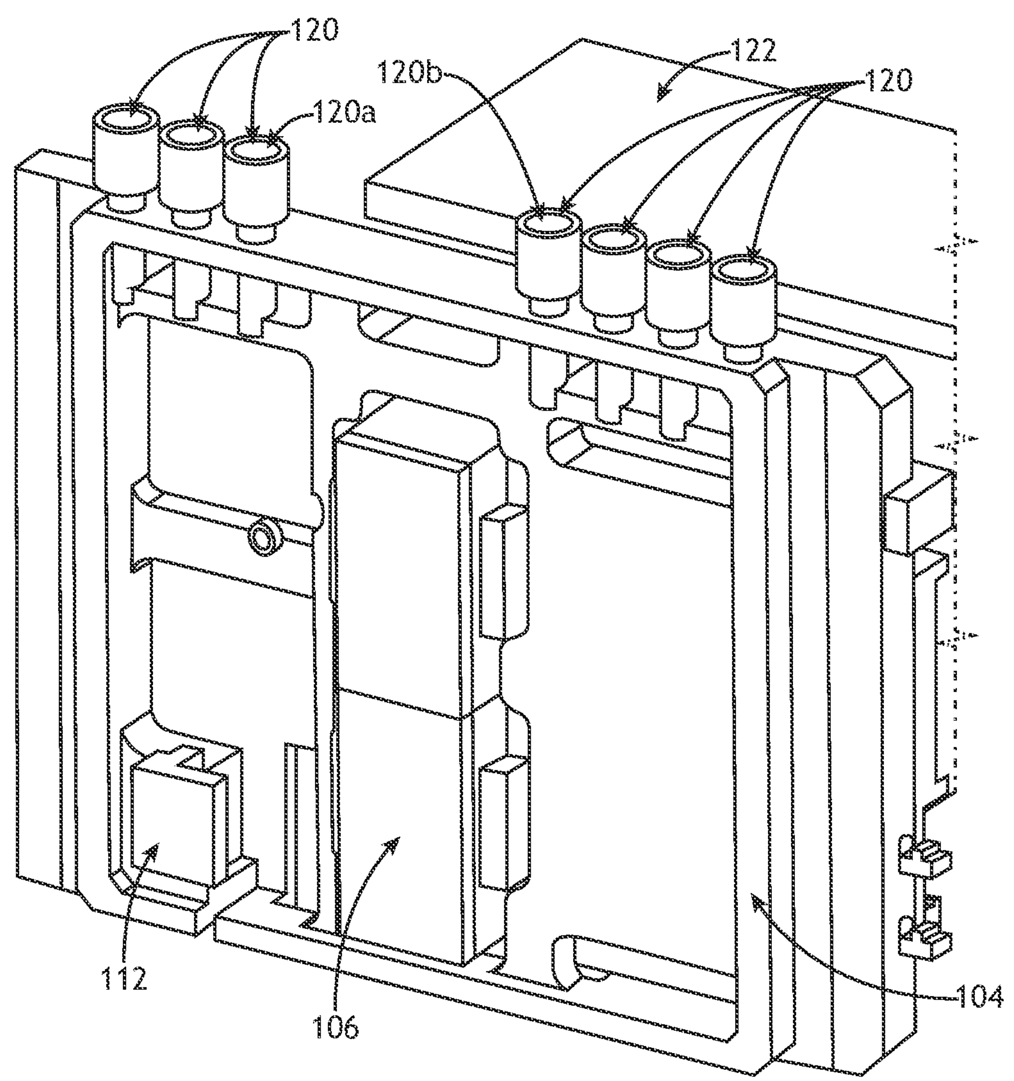
FIG. 1C is a partial perspective view of a translation stage including multiple magnetic counterbalances, in accordance with one or more embodiments of the present disclosure.

In some embodiments, a translation stage 100 includes multiple magnetic counterbalances 120 to distribute the counterbalance force. FIG. 1C is a partial perspective view of a translation stage 100 including multiple magnetic counterbalances 120, in accordance with one or more embodiments of the present disclosure. In particular, FIG. 1C depicts a view of portions of a moveable plate 104. For example, FIG. 1C depicts seven magnetic counterbalances 120 to counterbalance the moveable plate 104 as well as portions of a stage-positioning actuator 106 and an encoder 112. It is noted that portions of the fixed plate 102 as well as connections between the fixed plate 102 and various internal components are not depicted in FIG. 1C.

The use of multiple magnetic counterbalances 120 may provide various benefits. For example, distributing a counterbalance force between several magnetic counterbalances 120 may reduce the size and/or load requirements of each of the magnetic counterbalances 120 relative to an alternative configuration with a single magnetic counterbalance 120 suitable for counterbalancing the entire load weight. As an illustration, the seven magnetic counterbalances 120 depicted in FIG. 1C may distribute counterbalance forces along the X direction. As another example, distributing a counterbalance force between several magnetic counterbalances 120 may facilitate counterbalancing unevenly distributed load weight. For instance, an uneven distribution of the load weight around a counterbalance may introduce undesirable friction on guides 114 and/or rotations of the moveable plate 104. However, multiple magnetic counterbalances 120, potentially providing different counterbalance forces, may counteract such an uneven weight distribution. As an illustration, FIG. 1C depicts a non-symmetric distribution of magnetic counterbalances 120 suitable for balancing an uneven load weight. In particular, the translation stage 100 in FIG. 1C includes a platform 122 that is offset along a positive X direction, four magnetic counterbalances 120 near the platform 122, and three magnetic counterbalances 120 on an opposing side of the translation stage 100.

In some embodiments, the translation stage 100 includes at least one magnetic counterbalance 120 that provides an adjustable counterbalance force (e.g., an adjustable magnetic counterbalance 120). In a general sense, a translation stage 100 may include any combination of one or more magnetic counterbalances 120 with fixed and/or adjustable counterbalance forces.

An adjustable magnetic counterbalance 120 may be used in a variety of applications within the spirit and scope of the present disclosure. For example, one or more adjustable magnetic counterbalances 120 may enable fine tuning of a counterbalance force ($F_{counterbalance}$) to precisely counteract the load weight such that $$F_{counterbalance}=m\cdot g \quad (1)$$

where m is the load mass (e.g., a combined mass of the moveable plate 104 and any connected objects 118) and g is the acceleration due to gravity. Further, such fine tuning may be repeated as necessary when the mass of the objects 118 connected to the moveable plate 104 are changed. As another example, one or more adjustable magnetic counterbalances 120 at different positions along the translation stage 100 may enable fine tuning of a distribution of the counterbalance force in the presence of an unevenly distributed load weight. As an illustration, magnetic counterbalances 120*a,b* in FIG. 1C are adjustable.

Referring now to FIGS. 2A-8, magnetic counterbalances 120 are described in greater detail, in accordance with one or more embodiments of the present disclosure.

Figure 2A:
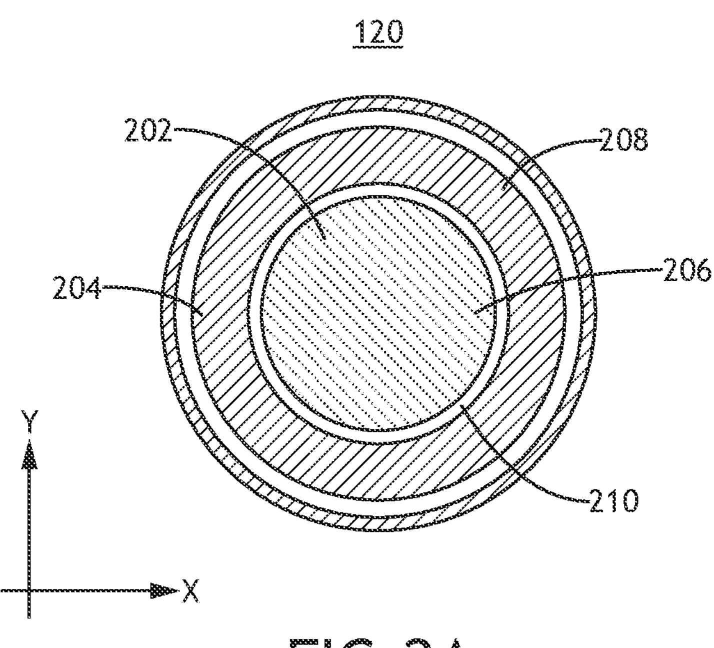
FIG. 2A is a top view of a magnetic counterbalance, in accordance with one or more embodiments of the present disclosure.
Figure 2B:
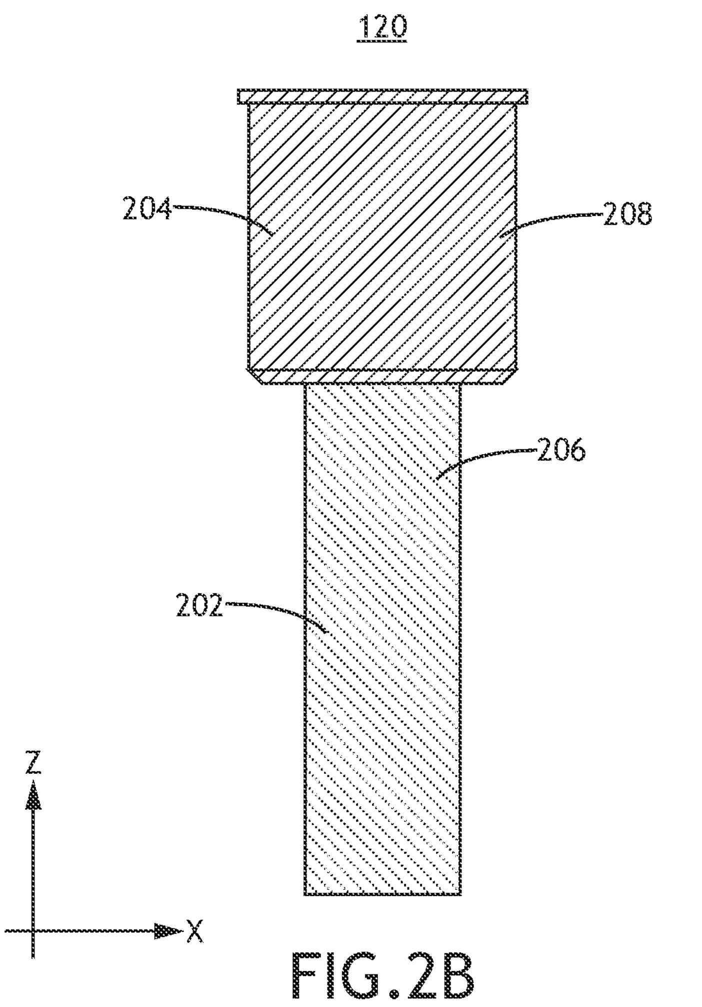
FIG. 2B is a side view of the magnetic counterbalance in FIG. 2A, in accordance with one or more embodiments of the present disclosure.

FIG. 2A is a top view of a magnetic counterbalance 120, in accordance with one or more embodiments of the present disclosure. FIG. 2B is a side view of the magnetic counterbalance 120 in FIG. 2A, in accordance with one or more embodiments of the present disclosure.

In some embodiments, a magnetic counterbalance 120 includes a first portion 202 and a second portion 204 at least partially surrounding the first portion 202 in a plane orthogonal to a direction of motion. In FIGS. 2A and 2B, a direction of motion is along the Z direction (e.g., a vertical direction) and the second portion 204 of the magnetic counterbalance 120 fully surrounds the first portion 202 in the X-Y plane (e.g., a horizontal plane). In this configuration, the first portion 202 may slide at least partially through the second portion 204 along the direction of motion.

In some embodiments, the first portion 202 includes at least one or more magnets 206, while the second portion 204 includes one or more ferromagnetic materials 208.

In this configuration, magnetic attraction between at least one magnet 206 in the first portion 202 and at least one ferromagnetic material 208 in the second portion 204 may provide a magnetic force attracting the first portion 202 and the second portion 204 to each other. This magnetic force may be exploited in any suitable manner to counter a load weight. In some embodiments, one of the magnet 206 or the ferromagnetic material 208 is attached to the fixed plate 102, while the other is attached to the moveable plate 104. Further, relative positions of the magnet 206 and the ferromagnetic material 208 may be adjusted such that the magnetic attractive force counters the load weight.

For example, FIGS. 2A and 2B depict a configuration in which the first portion 202 includes a single magnet 206 and the second portion 204 includes a single ferromagnetic material 208 (e.g., a ferromagnetic sleeve). In particular, the single magnet 206 is shaped as a rod with a long axis along the direction of motion (e.g., the vertical or Z direction) and the single ferromagnetic material 208 is shaped as a ring (or a portion thereof). Further, the moveable plate 104 may be connected to the magnet 206 and the fixed plate 102 may be connected to the ferromagnetic material 208. Accordingly, a load weight associated with the moveable plate 104 and any connected objects 118 may be associated with a force in the −Z direction, whereas the magnetic attractive force between the magnet 206 and the ferromagnetic material 208 may be associated with a counterbalance force in the +Z direction. However, it is to be understood that the configuration in FIG. 2B is provided solely for illustrative purposes and should not be interpreted as limiting on the present disclosure. Rather, alternative configurations in which the moveable plate 104 is connected to the ferromagnetic material 208 and the fixed plate 102 is connected to the magnet 206 are within the spirit and scope of the present disclosure.

Figure 3:
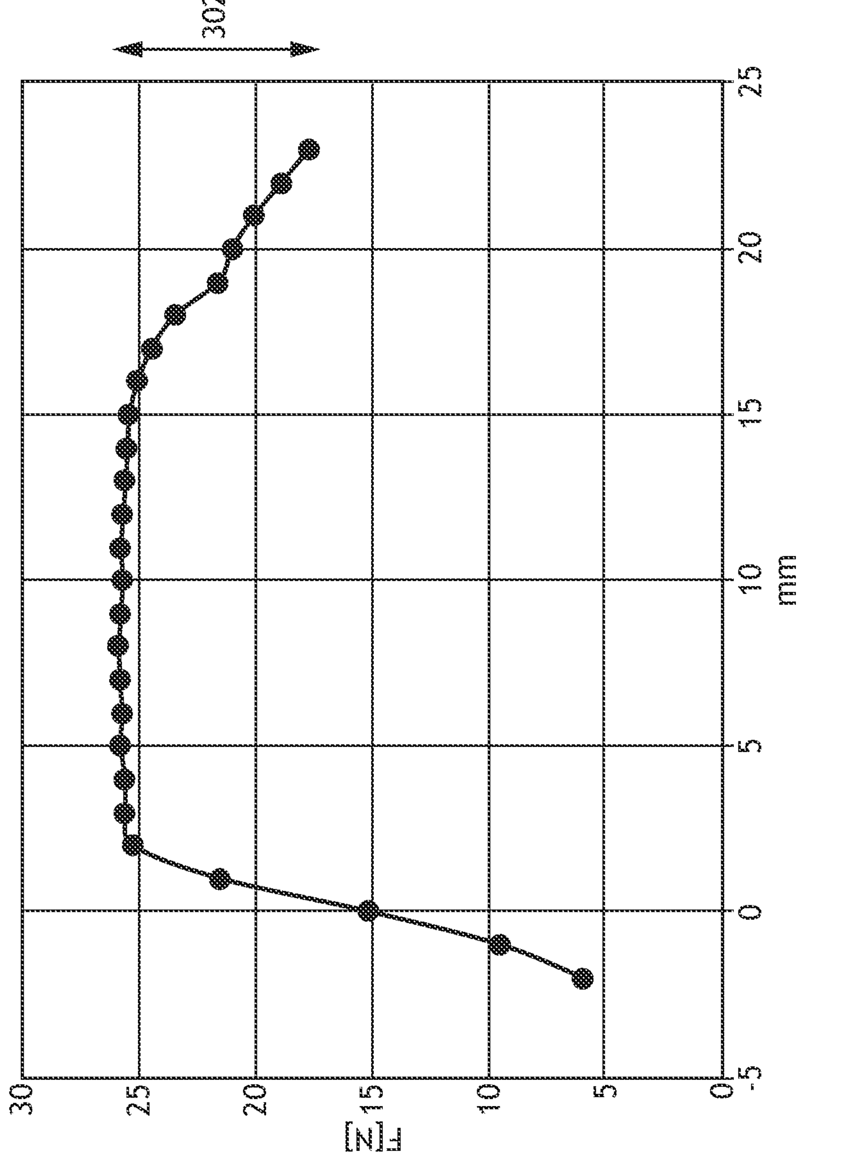
FIG. 3 is a plot of a counterbalance force provided by a magnetic counterbalance as a function of relative position between the magnet and the ferromagnetic material, in accordance with one or more embodiments of the present disclosure.

FIG. 3 is a plot of a counterbalance force (F[N]) provided by a magnetic counterbalance 120 as a function of relative position between the magnet 206 and the ferromagnetic material 208, in accordance with one or more embodiments of the present disclosure. In particular, the X axis of FIG. 3 relates to a relative position between a top edge of the magnet 206 and a bottom edge of the ferromagnetic material 208, where a negative number indicates a gap in the Z direction between the magnet 206 and the sleeve and a positive number indicates that the magnet 206 is at least partially in the ferromagnetic material 208. As illustrated in FIG. 3, a magnetic counterbalance 120 may provide a substantially linear counterbalance force over an operational range 302. The stage-positioning actuator 106 may thus adjust the relative position of the moveable plate 104 with respect to the fixed plate 102 across this range without a change in the counterbalance force and thus without a change in the load on the stage-positioning actuator 106.

In some embodiments, the first portion 202 and the second portion 204 of the magnetic counterbalance 120 are separated by a gap 210 that may be, but is not required to be, uniform in the plane orthogonal to the direction of motion (e.g., the X-Y plane in FIGS. 2A and 2B). This gap 210 may be filled with any suitable material. In some embodiments, the gap 210 is an air gap and filled with ambient atmosphere.

It is contemplated herein that an air gap 210 between the magnet 206 and the ferromagnetic material 208 may provide frictionless operation and thus avoid hysteresis and other negative impacts.

It is to be understood that FIGS. 2A-3 and the associated descriptions are provided solely for illustrative purposes and should not be interpreted as limiting the present disclosure. For example, the magnet 206 may generally have any cross-sectional shape (e.g., a shape in an X-Y plane as depicted in FIGS. 2A-2B) such as, but not limited to, circular, rectangular, or square. Further, the ferromagnetic material 208 may be shaped to provide a uniform gap 210 or may have a non-uniform gap 210. Further, the first portion 202 and/or the second portion 204 may have a combination of magnets 206 and ferromagnetic materials 208 arranged to provide a counterbalance force along the direction of motion.

Referring now to FIGS. 4A-6C, various designs and techniques of a magnetic counterbalance 120 are described in greater detail, in accordance with one or more embodiments of the present disclosure.

A magnet 206 may be formed from any material suitable to be formed as a permanent magnet such as, but not limited to, a ferromagnetic material, a rare-earth magnetic material (e.g., a neodymium-based magnetic material, or the like), or a composite material. A magnet 206 may further have any magnetic polarization direction. In some embodiments, a magnet 206 has an axial magnetic polarization along a direction of motion (e.g., the Z direction). In some embodiments, a magnet 206 has a direction of magnetic polarization within the plane orthogonal to a direction of motion (e.g., in the X-Y plane). A magnet 206 with this configuration may be referred to as being diametrically polarized.

A ferromagnetic material 208 may be formed from any suitable ferromagnetic or composite material having a non-zero magnetic permeability. Further, the ferromagnetic material 208 may be, but is not required to be, permanently magnetized (e.g., be a permanent magnet).

It is contemplated herein that the counterbalance force provided by a magnetic counterbalance 120 may generally be adjusted or otherwise controlled in various ways within the spirit and scope of the present disclosure.

In some embodiments, the magnetic counterbalance 120 includes one or more force adjustment actuators 124 to at least one of adjust a gap 210 distance between the first portion 202 and the second portion 204 of the magnetic counterbalance 120 along at least one direction in the horizontal plane or adjust a relative orientation between a magnetic polarization direction of the magnet 206 with respect to the ferromagnetic material 208.

In some embodiments, the ferromagnetic material 208 is asymmetric in the plane orthogonal to a direction of motion (e.g., an X-Y plane) and the magnet 206 has a magnetic polarization direction at least partially in the X-Y plane. As a result, a strength of the counterbalance force may be controlled by a relative rotation between the magnet 206 and the ferromagnetic material 208.

Figure 4A:
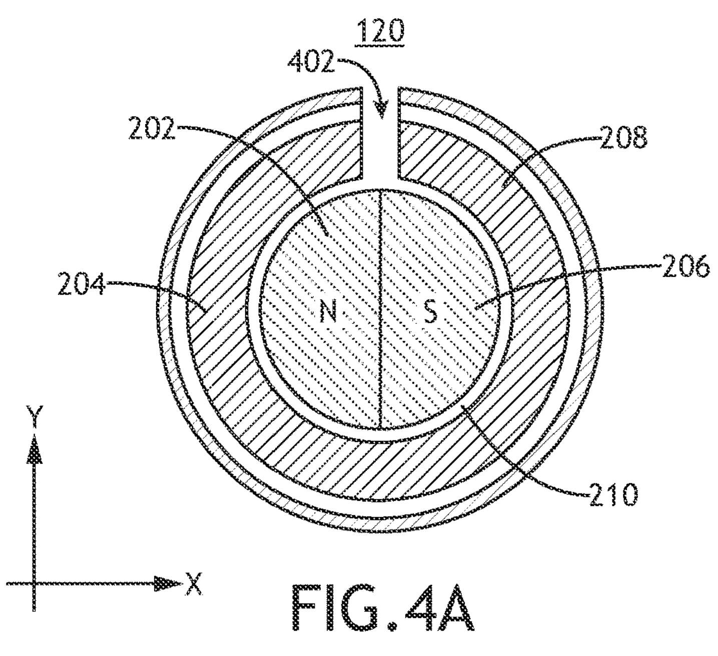
FIG. 4A is a top view of a magnetic counterbalance including a ferromagnetic material with a slit and a diametrically polarized magnet, in accordance with one or more embodiments of the present disclosure.
Figure 4B:
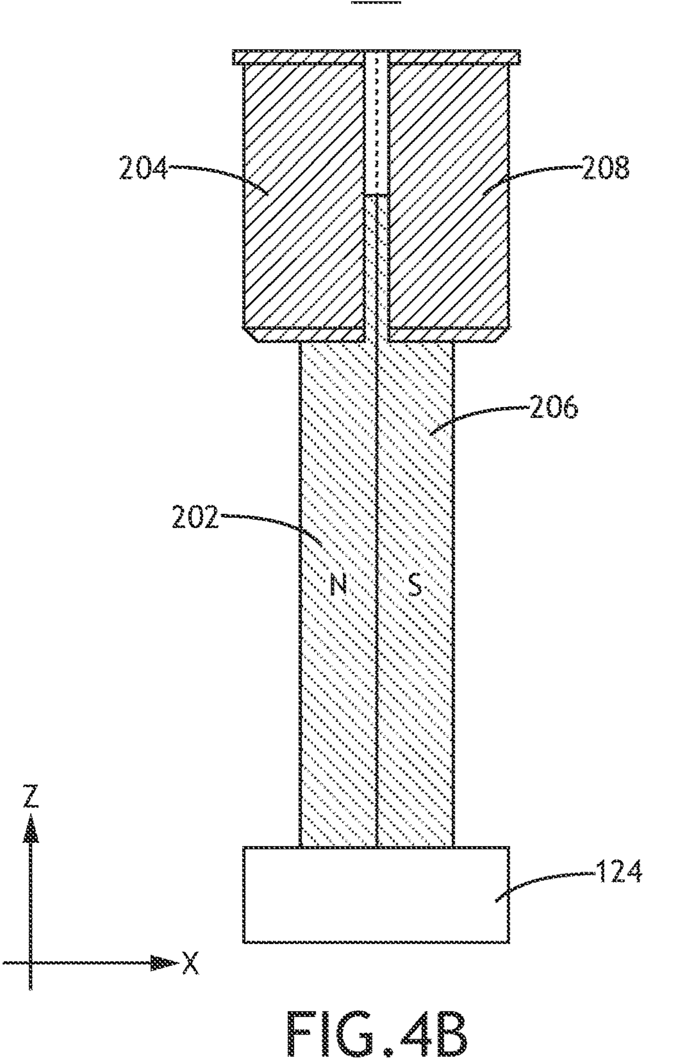
FIG. 4B is a side view of the magnetic counterbalance of FIG. 4A, in accordance with one or more embodiments of the present disclosure.

For example, the ferromagnetic material 208 may include one or more slits in the plane orthogonal to the direction of motion (e.g., the X-Y plane), which may weaken the magnetic field flow. As an illustration, FIG. 4A is a top view of a magnetic counterbalance 120 including a ferromagnetic material 208 with a slit 402 and a diametrically polarized magnet 206, in accordance with one or more embodiments of the present disclosure. FIG. 4B is a side view of the magnetic counterbalance 120 of FIG. 4A, in accordance with one or more embodiments of the present disclosure. In this way, the ferromagnetic material 208 may be shaped as a portion of a ring in the horizontal plane (e.g., the X-Y plane). Further, the magnet 206 in FIGS. 4A and 4B is oriented with a magnetic polarization direction along the X axis.

In some embodiments, a force adjustment actuator 124 includes a rotational actuator configured to adjust a relative rotation between the magnet 206 and/or the ferromagnetic material 208 in the horizontal plane (e.g., the X-Y plane). For example, a rotational force adjustment actuator 124 connected to the magnet 206 (e.g., as depicted in FIG. 4B) may rotate the magnet 206 relative to the ferromagnetic material 208 which may have, but is not required to have a fixed rotational position. As another example, a rotational force adjustment actuator 124 connected to the ferromagnetic material 208 may rotate the ferromagnetic material 208 relative to the magnet 206 which may have, but is not required to have, a fixed rotational position.

Figure 4C:
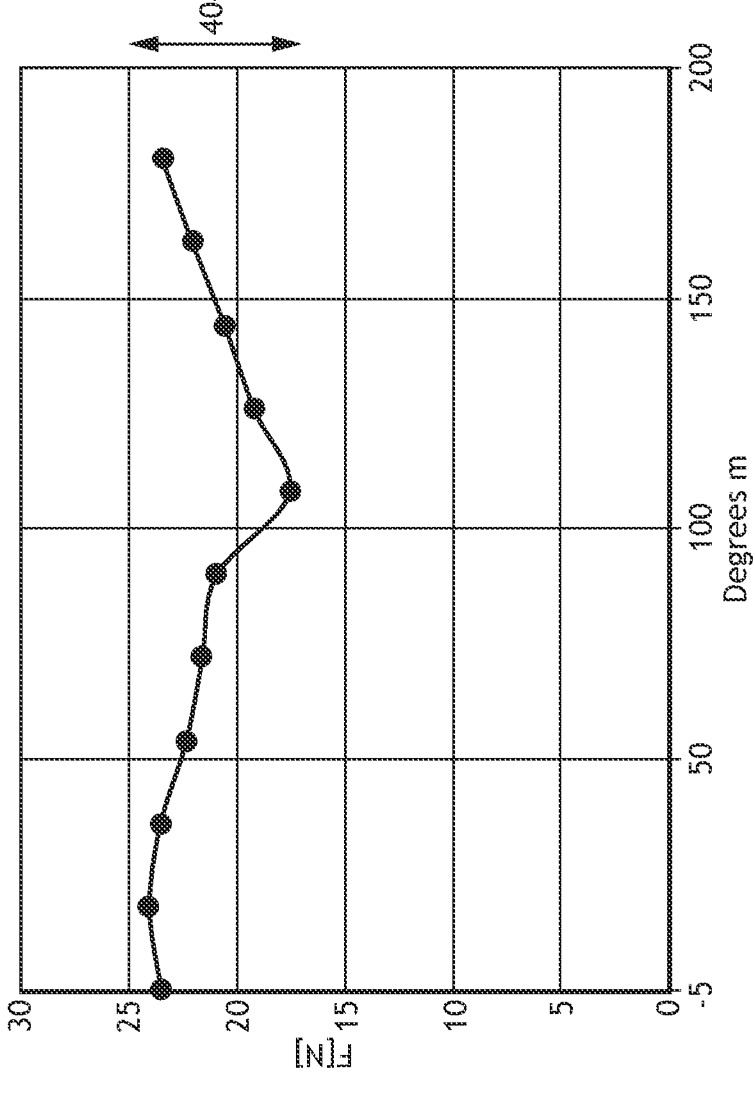
FIG. 4C is a plot of a counterbalance force provided by a magnetic counterbalance as a function of relative position between the magnet and the ferromagnetic material, in accordance with one or more embodiments of the present disclosure.

FIG. 4C is a plot of a counterbalance force provided by a magnetic counterbalance 120 as depicted in FIGS. 4A and 4B as a function of relative rotational angle between the magnet 206 and the ferromagnetic material 208, in accordance with one or more embodiments of the present disclosure. As shown in FIG. 4C, the counterbalance force may be adjusted within a force range 404 by adjusting this relative rotational angle between the magnet 206 and the ferromagnetic material 208.

In some embodiments, a force adjustment actuator 124 includes at least one linear actuator configured to modify the gap 210 distance between the magnet 206 and the ferromagnetic material 208 along at least one direction. For example, the second portion 204 of the magnetic counterbalance 120 may include two or more ferromagnetic materials 208 such that the positions of any of these ferromagnetic materials 208 relative to the first portion 202 (or at least one magnet 206 therein) may be adjusted with one or more force adjustment actuators 124.

Figures 5A, 5B:
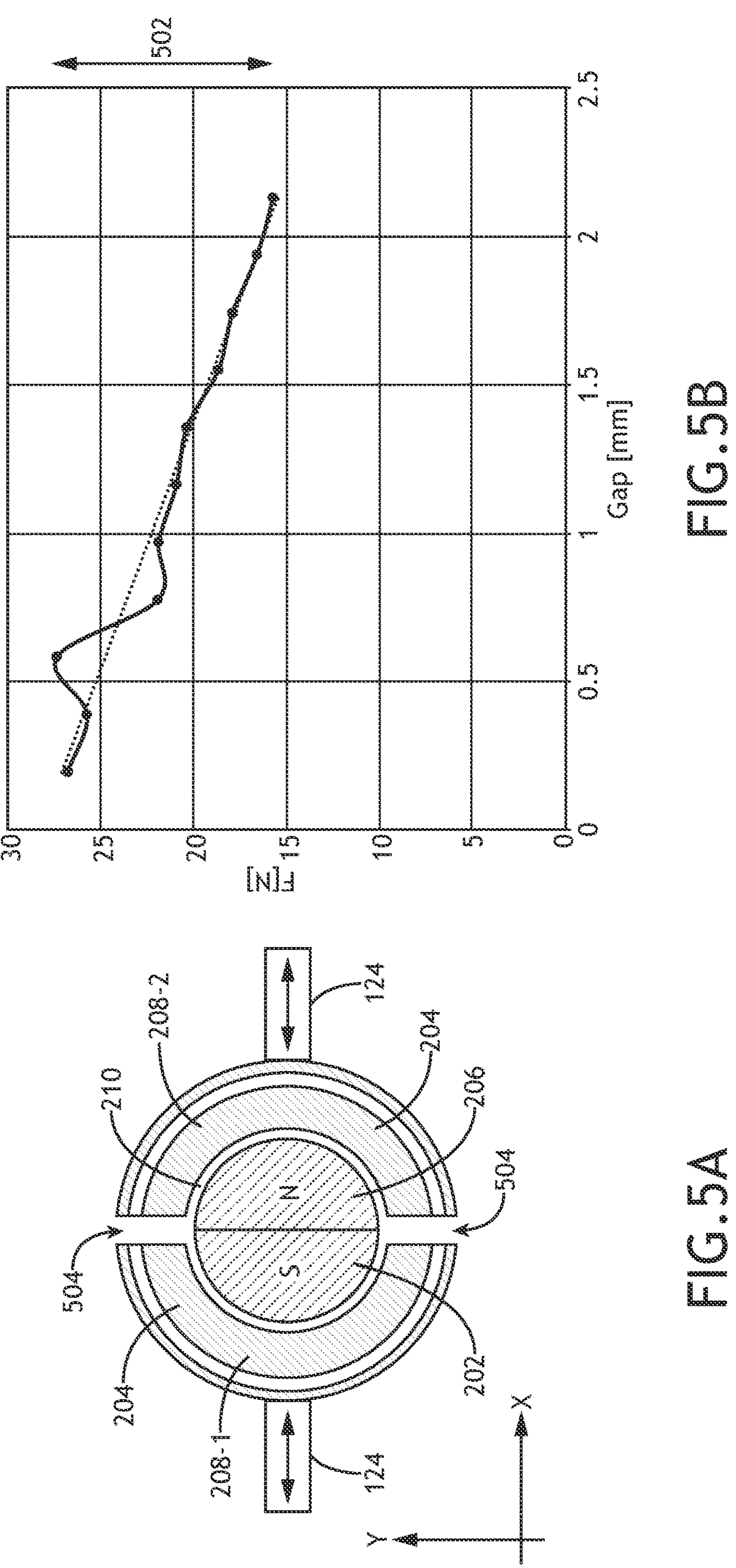
FIG. 5A is a top view of a magnetic counterbalance including a first portion formed as a diametrically polarized magnet and a second portion formed as two separate ferromagnetic materials that are individually positionable, in accordance with one or more embodiments of the present disclosure.
FIG. 5B is a plot of a counterbalance force provided by a magnetic counterbalance as depicted in FIG. 5A as a function of gap distance, in accordance with one or more embodiments of the present disclosure.

FIG. 5A depicts a non-limiting configuration of a magnetic counterbalance 120 providing an adjustable counterbalance force (e.g., an adjustable magnetic counterbalance 120), in accordance with one or more embodiments of the present disclosure.

FIG. 5A is a top view of a magnetic counterbalance 120 including a first portion 202 formed as a diametrically polarized magnet 206 and a second portion 204 formed as two separate ferromagnetic materials 208 that are individually positionable, in accordance with one or more embodiments of the present disclosure.

For example, the second portion 204 of the magnetic counterbalance 120 in FIG. 5A includes a first ferromagnetic material 208-1 and a second ferromagnetic material 208-2 which are positioned to at least partially surround the magnet 206. Further, the first ferromagnetic material 208-1 and the second ferromagnetic material 208-2 may be attached to force adjustment actuators 124 (not explicitly shown) to adjust the gap 210 distances between the corresponding ferromagnetic materials 208-1,208-2 and the magnet 206. In some embodiments, the force adjustment actuators 124 adjust the first ferromagnetic material 208-1 and the second ferromagnetic material 208-2 in a symmetric manner along radial directions (e.g., along the X axis in FIG. 5A).

FIG. 5B is a plot of a counterbalance force provided by a magnetic counterbalance 120 as depicted in FIG. 5A as a function of gap 210 distance, in accordance with one or more embodiments of the present disclosure. For example, force adjustment actuators 124 adjusted positions of the first ferromagnetic material 208-1 and the second ferromagnetic material 208-2 to each have the same gap 210, corresponding to the X axis in FIG. 5B. As depicted in FIG. 5B, the counterbalance force may be adjusted over a force range 502 by adjusting the gap 210.

It is to be understood that FIGS. 5A-5B and the associated descriptions are provided solely for illustrative purposes and should not be interpreted as limiting. For example, a magnetic counterbalance 120 may include any number of ferromagnetic materials 208 with positions that are adjustable using any number of force adjustment actuators 124. As another example, the various ferromagnetic materials 208 may be shaped to have slits 504 (e.g., openings, spaces, or the like) at all values of the gap 210 as depicted in FIG. 5A or may be shaped to come into contact for at least one value of the gap 210 (not shown).

Figure 6A:
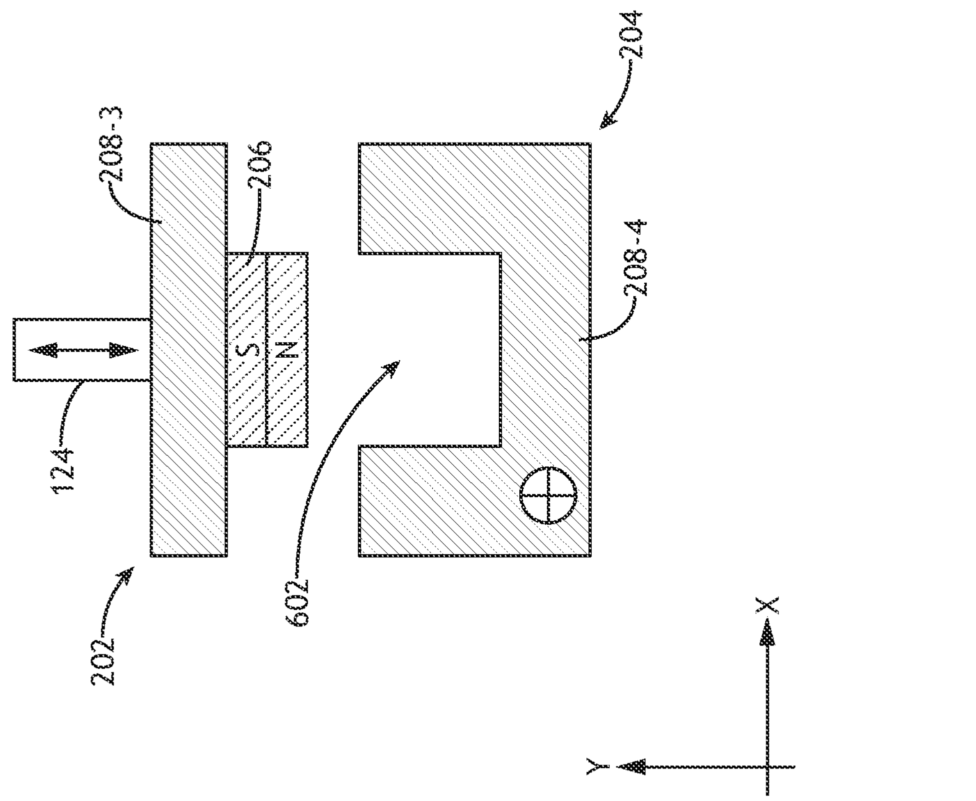
FIG. 6A is a top view of a magnetic counterbalance including a first portion with a magnet and a ferromagnetic material as well as a second portion with a single U-shaped ferromagnetic material, in accordance with one or more embodiments of the present disclosure.
Figure 6C:
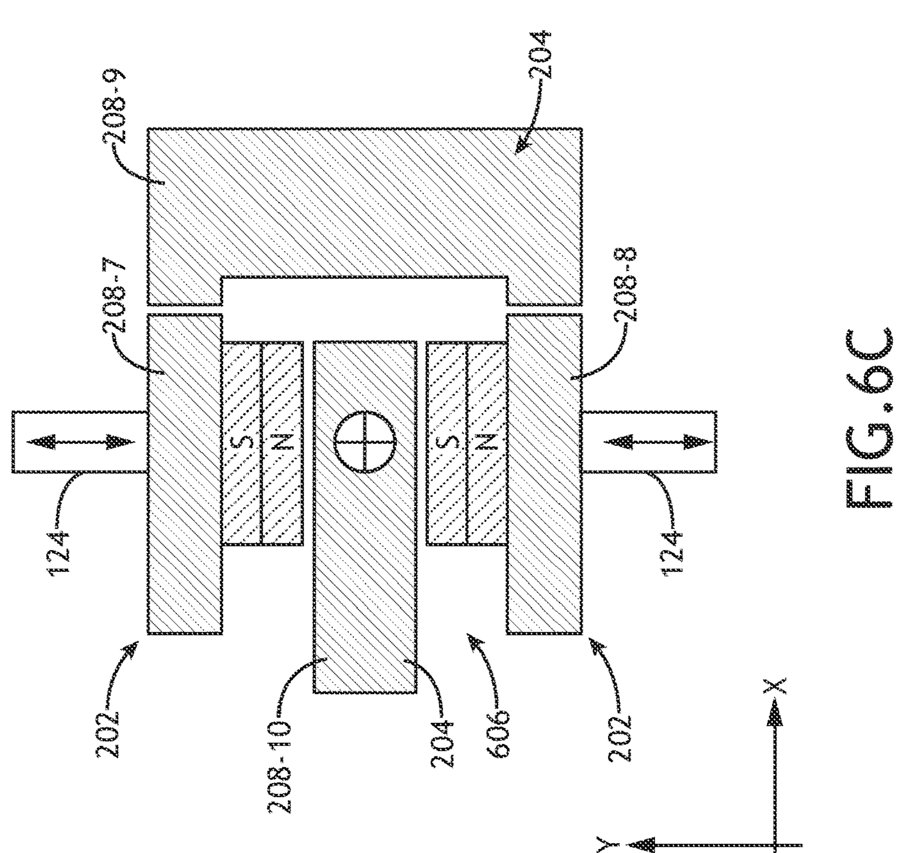
FIG. 6C is a top view of a magnetic counterbalance including a first portion with two separately-positionable magnets attached to separate ferromagnetic materials as well as a second portion with two ferromagnetic materials, in accordance with one or more embodiments of the present disclosure.
Figure 6B:
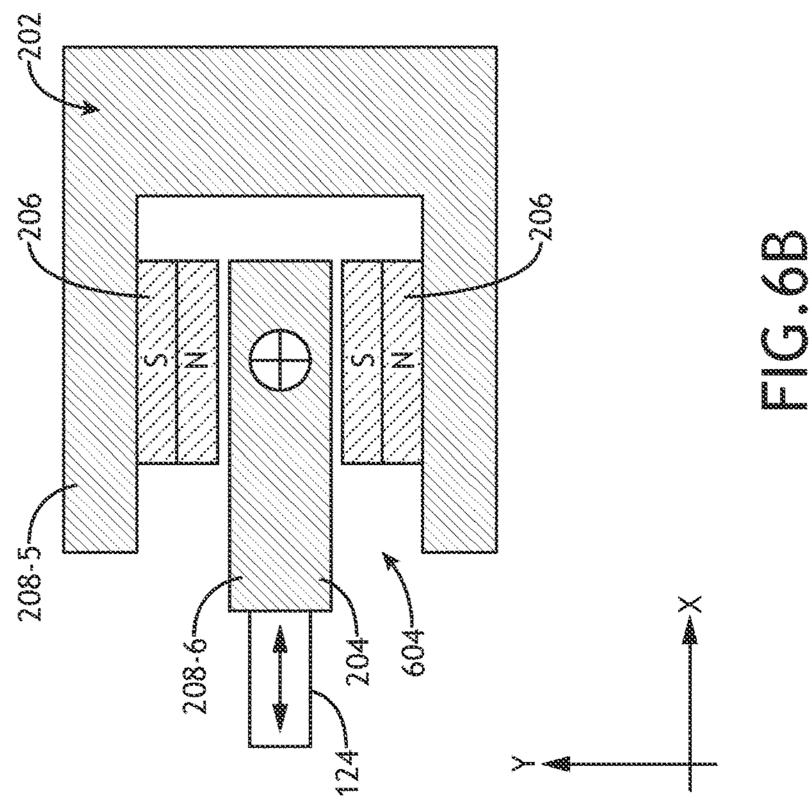
FIG. 6B is a top view of a magnetic counterbalance including a first portion with two magnets attached to a U-shaped ferromagnetic material as well as a second portion with a single ferromagnetic material, in accordance with one or more embodiments of the present disclosure.

Referring now to FIGS. 6A-6C, in some embodiments, at least one of the first portion 202 or the second portion 204 of a magnetic counterbalance 120 includes both a magnet 206 and a ferromagnetic material 208.

FIG. 6A is a top view of a magnetic counterbalance 120 including a first portion 202 with a magnet 206 and a ferromagnetic material 208-3 as well as a second portion 204 with a single U-shaped ferromagnetic material 208-4, in accordance with one or more embodiments of the present disclosure. In this configuration the first portion 202 and/or the second portion 204 may be mounted on one or more force adjustment actuators 124 to adjust a relative separation in the X-Y plane. For example, the magnet 206 may be sized to at least partially fit within a cavity 602 associated with the U-shaped ferromagnetic material 208-4.

FIG. 6B is a top view of a magnetic counterbalance 120 including a first portion 202 with two magnets 206 attached to a U-shaped ferromagnetic material 208-5 as well as a second portion 204 with a single ferromagnetic material 208-6, in accordance with one or more embodiments of the present disclosure. Further, the second portion 204 may fit within an interior cavity 604 formed by the first portion 202. In this configuration the first portion 202 and/or the second portion 204 may be mounted on one or more force adjustment actuators 124 to adjust a relative separation in the X-Y plane.

FIG. 6C is a top view of a magnetic counterbalance 120 including a first portion 202 with two separately-positionable magnets 206 attached to separate ferromagnetic materials 208-7,208-8 as well as a second portion 204 with a two ferromagnetic materials 208-9,208-10, in accordance with one or more embodiments of the present disclosure. Further, the second portion 204 may fit within an interior cavity 606 formed by the first portion 202. In this configuration the first portion 202 and/or the second portion 204 may be mounted on one or more force adjustment actuators 124 to adjust a relative separation in the X-Y plane.

It is to be understood that FIGS. 6A-6C and the associated descriptions are provided solely for illustrative purposes and should not be interpreted as limiting. For example, a magnetic counterbalance 120 may include any combination of magnets 206 and ferromagnetic materials 208 on the first portion 202 and/or the second portion 204 suitable for providing a counterbalance force. Further, any number of force adjustment actuators 124 may be used to position any portions of the first portion 202 and the second portion 204 of the magnetic counterbalance 120.

Referring again to FIG. 1A, various additional aspects of the translation stage 100 are described in greater detail, in accordance with one or more embodiments of the present disclosure.

In some embodiments, the translation stage 100 includes a controller 126 with one or more processors 128 configured to execute a set of program instructions maintained in memory 130 (e.g., a memory device).

The one or more processors 128 of a controller 126 may include any processor or processing element known in the art. In this sense, the one or more processors 128 may include any microprocessor-type device configured to execute algorithms and/or instructions. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 128 may include any device configured to execute algorithms and/or instructions (e.g., program instructions stored in memory). In some embodiments, the one or more processors 128 may be embodied as a desktop computer, mainframe computer system, workstation, image computer, parallel processor, networked computer, or any other computer system configured to execute a program configured to operate or operate in conjunction with the translation stage 100, as described throughout the present disclosure. Moreover, different subsystems of the translation stage 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 126 may include one or more controllers housed in a common housing or within multiple housings. In this way, any controller or combination of controllers may be separately packaged as a module suitable for integration into the translation stage 100.

The memory 130 may include any storage medium known in the art suitable for storing program instructions executable by the associated one or more processors 128. For example, the memory 130 may include a non-transitory memory medium. By way of another example, the memory 130 may include, but is not limited to, a read-only memory (ROM), a random-access memory (RAM), a magnetic or optical memory device (e.g., disk), a magnetic tape, a solid-state drive and the like. It is further noted that the memory 130 may be housed in a common controller housing with the one or more processors 128. In some embodiments, the memory 130 may be located remotely with respect to the physical location of the one or more processors 128 and the controller 126. For instance, the one or more processors 128 of the controller 126 may access a remote memory (e.g., server), accessible through a network (e.g., internet, intranet and the like).

The controller 126 may include or be coupled with any component or combination of components in the translation stage 100. Further, the controller 126 may receive data from any components in the translation stage 100 and/or control any components in the translation stage 100 via drive signals. For example, the controller 126 may be coupled with the force adjustment actuators 124 and thus generate drive signals to adjust the positions of the first portion 202 or the second portion 204 of the magnetic counterbalance 120 (or any components thereof). In this way, the controller 126 may be communicatively coupled to the translation stage 100 or any component therein.

Figure 7A:
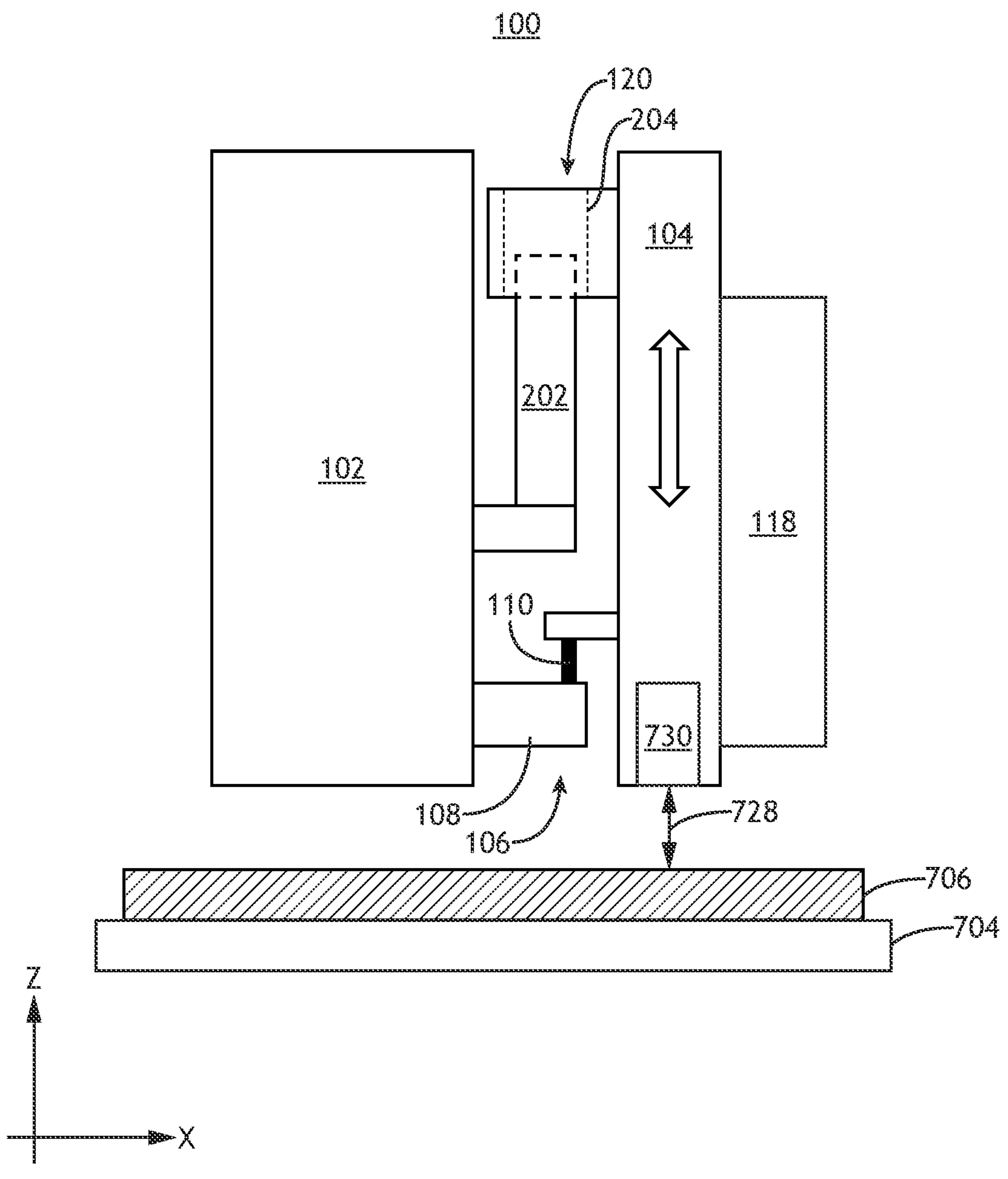
FIG. 7A is a simplified schematic view of a system including a translation stage oriented in a vertical direction and an additional translation stage for securing and/or positioning a sample, in accordance with one or more embodiments of the present disclosure.
Figure 7B:
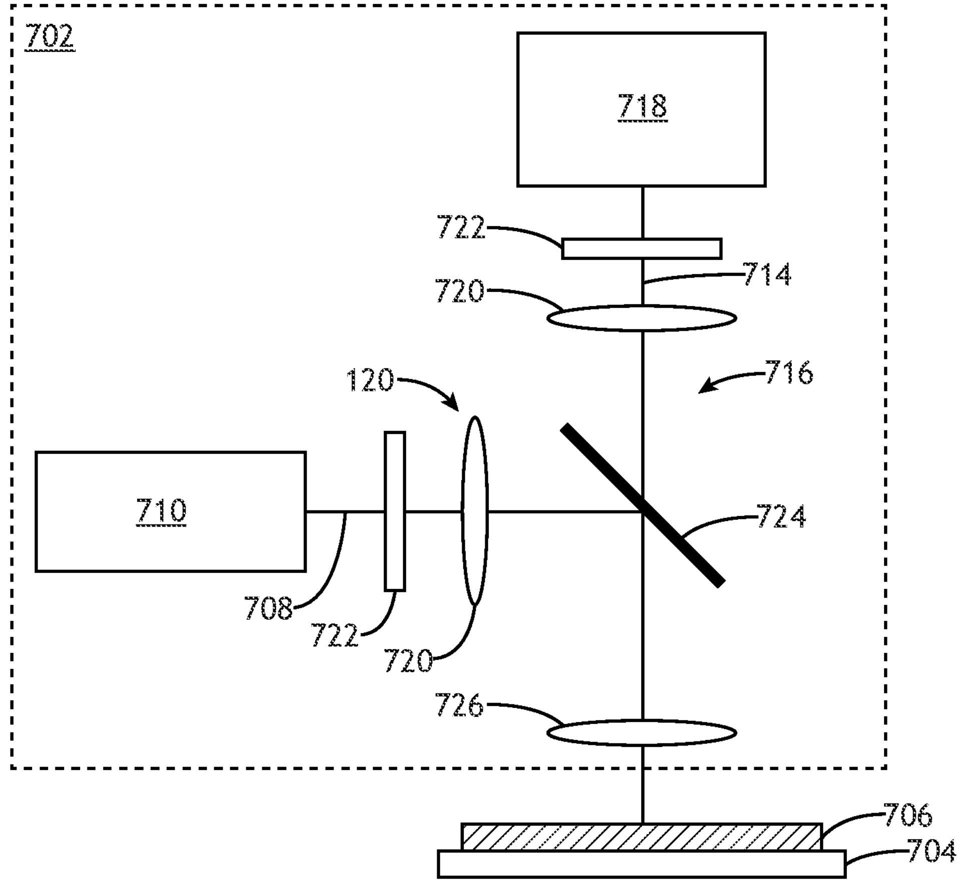
FIG. 7B is a simplified schematic view of an optical metrology system, in accordance with one or more embodiments of the present disclosure.

Referring now to FIGS. 7A-7B, the integration of a translation stage 100 within a larger system is described in greater detail, in accordance with one or more embodiments of the present disclosure.

FIG. 7A is a simplified schematic view of a system 702 including a translation stage 100 oriented in a vertical direction and an additional translation stage 704 for securing and/or positioning a sample 706, in accordance with one or more embodiments of the present disclosure.

In some embodiments, various components of the system 702 are mounted to the moveable plate 104 of the translation stage 100 (e.g., as objects 118). In this configuration, the load weight may include combined weights of the moveable plate 104 and any attached components. Precise counterbalancing using one or more magnetic counterbalances 120 and optionally one or more tunable magnetic counterbalances 120 may then provide for precise, tunable control of the position of the components relative to the sample 706.

It is contemplated herein that the system 702 with at least some components mounted to a translation stage 100 as disclosed herein may be well suited for, but not limited to, metrology applications in which a distance between a sample 706 and one or more components of a metrology system. For example, the system 702 may include an optical system such as, but not limited to, an optical metrology system, or an imager. As another example, the system 702 may include a non-optical metrology system.

FIG. 7B is a simplified schematic view of an optical metrology system 702, in accordance with one or more embodiments of the present disclosure.

In some embodiments, the system 702, is configurable according to a metrology recipe to generate a metrology measurement associated with the sample 706 based on the metrology recipe. For example, the system 702 may direct an illumination beam 708 from an illumination source 710 to the sample 706 (e.g., via an illumination pathway 712), collect light or other radiation emanating from the sample 706 in response to the (referred to herein as measurement light 714) (e.g., via a collection pathway 716), and generate metrology data from at least one detector 718 based on the measurement light 714. For example, metrology data may be associated with diffraction of the illumination beam 708 from the sample 706. The illumination pathway 712 and the collection pathway 716 may further include additional optical elements such as, but not limited to, lenses 720 and beam manipulation components 722 (e.g., polarizers, spectral filters, spatial filters, beam blockers, apertures, or the like) at any suitable locations. In some embodiments, as illustrated in FIG. 7B, the system 702 includes one or more beamsplitters 724 to allow simultaneous illumination and collection through a common objective lens 726 or other focusing element.

The system 702 may include one or more detectors 718 at any suitable locations for the collection of metrology data. For example, the system 702 may include at least one detector 718 at a field plane (e.g., a plane conjugate to the sample 706), which is illustrated in FIG. 7B. As another example, though not illustrated, the system 702 may include at least one detector 718 at a pupil plane (e.g., a diffraction plane corresponding to an angular distribution of light from the sample 706). Further, although not illustrated, the system 702 may include multiple channels, each having a separate detector 718. The system 702 may further include optical components to modify the properties of the measurement light 714 within each channel such as, but not limited to, polarizers, polarization rotators, spectral filters, spatial filters, or pupil filters (e.g., beam blocks or apertures in a pupil plane to block or pass selected diffraction orders).

Referring generally to FIGS. 7A and 7B, any components of the system 702 may be mounted to the moveable plate 104 of the translation stage 100 (e.g., as objects 118). For example, such objects 118 mounted to the moveable plate 104 may include at least a lens (e.g., the objective lens 726 and a detector 718). In this way, the system may operate as an imaging system and the adjustments to a position of the moveable plate 104 (e.g., by the controller 126) may be provide control over a separation distance 728 between the lens and the sample 706 (e.g., a working distance). In some embodiments, as depicted in FIG. 7B, such objects 118 mounted to the moveable plate 104 may further include the illumination source 710. In some embodiments, such objects 118 mounted to the moveable plate 104 may include a photomask, where the photomask and the lens are arranged to project an image of the photomask on the sample 706. In this way, the system 702 may operate as an optical projection system, a lithography system (e.g., a scanner or a stepper), or the like.

In some embodiments, the system 702 includes one or more sensors 730 to monitor a position of the sample 706. For example, a sensor 730 may measure, track, or otherwise monitor a position of the sample 706 along the vertical direction. As another example, a sensor 730 may measure, track, or otherwise monitor a separation distance 728 between the sample 706 and the at least one of the one or more objects 118 on the moveable plate 104 (e.g., a lens, or the like).

The sensor 730 may include any type of device known in the art suitable for determining a position of the sample 706 or changes thereof over time such as, but not limited to, a proximity sensor or a distance sensor. Further, the sensor 730 may utilize any technique such as, but not limited to, an optical technique or a capacitive technique.

In some embodiments, the system 702 may maintain (e.g., via drive signals from the controller 126 to the stage-positioning actuator 106) a selected distance between the sample 706 and one or more objects 118 on the translation stage 100. For example, the system 702 may maintain this selected distance as the sample 706 is translated by the additional translation stage 704 (e.g., along the horizontal plane).

It is contemplated herein that counterbalancing a translation stage 100 using one or more magnetic counterbalances 120 as disclosed herein, where the counterbalance force is finely tuned to match the load weight using at least one tunable magnetic counterbalance 120 as disclosed herein may enable relatively high-frequency height control. In particular, a stage-positioning actuator 106 used to control a position of the moveable plate 104 need not bear the load weight. In some applications, the height may be controlled on the order of 10 Hz or greater (e.g., hundreds of Hz, kHz, or greater).

Figure 8:
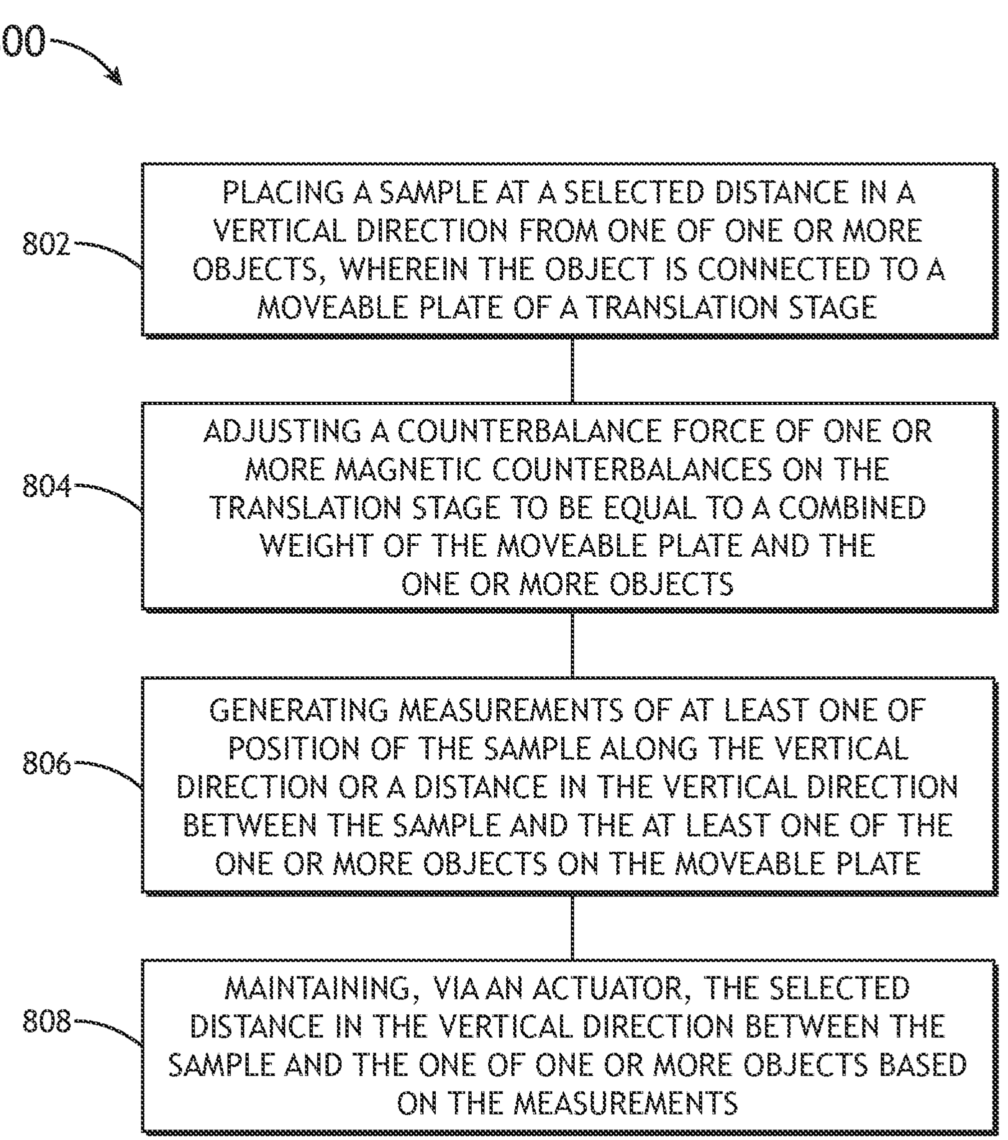
FIG. 8 is a flow diagram illustrating steps performed in a method, in accordance with one or more embodiments of the present disclosure.

FIG. 8 is a flow diagram illustrating steps performed in a method 800, in accordance with one or more embodiments of the present disclosure. Applicant notes that the embodiments and enabling technologies described previously herein in the context of the translation stage 100 should be interpreted to extend to the method 800. It is further noted, however, that the method 800 is not limited to the architecture of the translation stage 100.

In some embodiments, the method 800 includes a step 802 of placing a sample 706 at a selected distance in a vertical direction from one of one or more objects 118 connected to a moveable plate 104 of a translation stage 100. For example, in the case of an optical system, the selected distance may correspond to a working distance of a lens. In some embodiments, the method 800 includes a step 804 of adjusting a counterbalance force of one or more magnetic counterbalances 120 on the translation stage 100 to be equal to a combined weight of the moveable plate 104 and the one or more objects 118. For example, at least one of the magnetic counterbalances 120 may have an adjustable counterbalance force. In this way, a stage-positioning actuator 106 used to control a position of the moveable plate 104 and thus the associated objects 118 connected thereon need not bear the associated load weight. As a result, high-frequency dynamic height control with minimal heat is enabled. In some embodiments, the method 800 includes a step 806 of generating measurements of at least one of position of the sample 706 along the vertical direction or a distance in the vertical direction between the sample 706 and the at least one of the one or more objects 118 on the moveable plate 104. For example, the measurements may be generated using one or more sensors 730. In some embodiments, the method 800 includes a step 808 of maintaining the selected distance in the vertical direction between the sample 706 and the one of one or more objects 118 based on the measurements. For example, the selected distance may be maintained as the sample 706 is translated along a horizontal plane.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A translation stage comprising:

a first plate;

a second plate, wherein the second plate is moveable with respect to the first plate along a vertical direction associated with a weight of the second plate;

one or more magnetic counterbalances coupled to the first and second plates and providing a counterbalance force to the second plate in the vertical direction opposing the weight of the second plate, wherein at least one of the one or more magnetic counterbalances comprises a tunable magnetic counterbalance, wherein the tunable magnetic counterbalance comprises:

a first portion including a rod including one or more magnets, wherein the first portion is attached to one of the first plate or the second plate; and a second portion including a ferromagnetic sleeve formed from one or more ferromagnetic materials and at least partially surrounding the one or more magnets of the rod, wherein the second portion is attached to a different one of the first plate or the second plate than the first portion, wherein the one or more ferromagnetic materials of the ferromagnetic sleeve at least partially surround the one or more magnets in a horizontal plane orthogonal to the vertical direction, wherein the first and second portions are separated by a gap, wherein the counterbalance force is adjustable by controlling at least one of a relative rotation angle between the first and second portions in the horizontal plane or a length of the gap along at least one direction, wherein the ferromagnetic sleeve includes a slit configured to weaken magnetic field flow;

a motorized actuator mechanically coupled to at least one of the first portion or the second portion and configured to adjust the relative rotation angle between the first and second portions in the horizontal plane, wherein the actuator is operatively connected to a controller configured to execute program instructions to automatically tune the counterbalance force;

an actuator configured to position the second plate with respect to the first plate along the vertical direction; and an encoder, wherein the encoder is configured to measure a relative position of the second plate and provide feedback to the actuator.

2. The translation stage of claim 1, wherein at least one of the one or more magnets has a magnetic polarization direction at least partially in the horizontal plane, wherein the one or more ferromagnetic materials are distributed with at least one slit in the horizontal plane, wherein the counterbalance force is adjustable by controlling the relative rotation angle between the first and second portions in the horizontal plane.

3. The translation stage of claim 2, wherein the one or more magnets comprise:

a single magnet with the magnetic polarization direction at least partially in the horizontal plane.

4. The translation stage of claim 3, wherein the single magnet is shaped as a rod with a long axis along the vertical direction.

5. The translation stage of claim 4, wherein the rod has a circular cross section in the horizontal plane.

6. The translation stage of claim 4, wherein the rod has a rectangular cross section in the horizontal plane.

7. The translation stage of claim 3, wherein the one or more ferromagnetic materials comprise:

a single ferromagnetic material shaped as a portion of a ring in the horizontal plane.

8. The translation stage of claim 1, wherein the tunable magnetic counterbalance further includes one or more additional actuators connected to at least one of the first or second portions to adjust the length of the gap in the at least one direction.

9. The translation stage of claim 8, wherein the one or more ferromagnetic materials comprises:

two or more ferromagnetic materials, wherein the one or more additional actuators adjust a gap distance between at least one of the two or more ferromagnetic materials and at least one of the one or more magnets.

10. The translation stage of claim 1, further comprising: one or more guides to constrain motion between the first and second plates to the vertical direction.

11. The translation stage of claim 1, wherein the first portion includes one or more additional ferromagnetic materials, wherein the one or more ferromagnetic materials and the one or more additional ferromagnetic materials at least partially surround the one or more magnets.

12. The translation stage of claim 1, wherein the actuator comprises a linear direct drive actuator.

13. A system comprising:

a first plate;

a second plate, wherein the second plate is moveable with respect to the first plate along a vertical direction associated with a weight of the second plate, wherein the second plate is configured to connect to one or more objects;

one or more magnetic counterbalances coupled to the first and second plates and providing a counterbalance force to the second plate in the vertical direction opposing the weight of the second plate, wherein at least one of the one or more magnetic counterbalances comprises a tunable magnetic counterbalance, wherein the tunable magnetic counterbalance comprises:

a first portion including a rod including one or more magnets, the first portion attached to one of the first plate or the second plate; and a second portion including a ferromagnetic sleeve formed from one or more ferromagnetic materials and at least partially surrounding the one or more magnets of the rod, the second portion attached to a different one of the first plate or the second plate than the first portion, wherein the one or more ferromagnetic materials of the ferromagnetic sleeve at least partially surround the one or more magnets in a horizontal plane orthogonal to the vertical direction, wherein the first and second portions are separated by a gap, wherein the counterbalance force is adjustable by controlling at least one of a relative rotation angle between the first and second portions in the horizontal plane or a length of the gap along at least one direction, wherein the ferromagnetic sleeve includes a slit configured to weaken magnetic field flow;

a motorized actuator mechanically coupled to at least one of the first portion or the second portion and configured to adjust the relative rotation angle between the first and second portions in the horizontal plane, wherein the actuator is configured to automatically tune the counterbalance force;

a translation stage for positioning a sample in at least the horizontal plane;

an actuator configured to position the second plate with respect to the first plate along the vertical direction;

an encoder, wherein the encoder is configured to measure a relative position of the second plate; and a controller communicatively coupled to the tunable magnetic counterbalance, the controller including one or more processors configured to execute program instructions causing the one or more processors to:

receive a relative position of the second plate; and provide feedback to the motorized actuator and the actuator via one or more drive signals.

14. The system of claim 13, wherein the one or more processors are further configured to execute program instructions causing the one or more processors to direct, via one or more additional drive signals, the at least one tunable magnetic counterbalance to adjust the counterbalance force to be equal to a combined weight of the second plate and the one or more objects.

15. The system of claim 13, wherein positioning the second plate with respect to the first plate along the vertical direction positions at least one of the one or more objects on the second plate with respect to the sample.

16. The system of claim 13, further comprising:

a sensor to measure at least one of position of the sample along the vertical direction or a distance in the vertical direction between the sample and the at least one of the one or more objects on the second plate, wherein the one or more processors are further configured to execute program instructions causing the one or more processors to maintain, via the one or more drive signals sent to the actuator, the selected distance in the vertical direction between the sample and the one of the one or more objects on the second plate.

17. The system of claim 13, wherein at least one of the one or more magnets has a magnetic polarization direction at least partially in the horizontal plane, wherein the one or more ferromagnetic materials are distributed with at least one slit in the horizontal plane, wherein the counterbalance force is adjustable by controlling the relative rotation angle between the first and second portions in the horizontal plane.

18. The system of claim 17, wherein the one or more magnets comprise:

a single magnet with the magnetic polarization direction at least partially in the horizontal plane.

19. The system of claim 18, wherein the single magnet is shaped as a rod with a long axis along the vertical direction.

20. The system of claim 19, wherein the rod has a circular cross section in the horizontal plane.

21. The system of claim 19, wherein the rod has a rectangular cross section in the horizontal plane.

22. The system of claim 18, wherein the one or more ferromagnetic materials comprise:

a single ferromagnetic material shaped as a portion of a ring in the horizontal plane.

23. The system of claim 13, wherein the tunable magnetic counterbalance further includes one or more additional actuators connected to at least one of the first or second portions to adjust the length of the gap in the at least one direction.

24. The system of claim 23, wherein the one or more ferromagnetic materials comprises:

two or more ferromagnetic materials, wherein the one or more additional actuators adjust a gap distance between at least one of the two or more ferromagnetic materials and at least one of the one or more magnets.

25. The system of claim 13, further comprising:

one or more guides to constrain motion between the first and second plates to the vertical direction.

26. The system of claim 13, wherein the one or more objects connected to the second plate include a lens, wherein the selected distance in the vertical direction between the sample and the one of the one or more objects on the second plate corresponds to a distance between the sample and the lens.

27. The system of claim 26, wherein the one or more objects further include a detector configured to image at least a portion of the sample through the lens.

28. The system of claim 27, wherein the one or more objects further include an illumination source to illuminate the at least the portion of the sample.

29. The system of claim 27, wherein the system comprises a metrology system.

30. The system of claim 27, wherein the system comprises an imaging system.

31. The system of claim 26, wherein the one or more objects further include a photomask, wherein the photomask and the lens are arranged to project an image of the photomask on the sample.

32. A method comprising:

placing a sample at a selected distance in a vertical direction from one of one or more objects, wherein the object is connected to a translation stage, wherein the translation stage comprises:

a first plate;

a second plate, wherein the second plate is moveable with respect to the first plate along the vertical direction, wherein the vertical direction is associated with a weight of the second plate, wherein the one or more objects are connected to the second plate;

one or more magnetic counterbalances coupled to the first and second plates and providing a counterbalance force to the second plate in the vertical direction opposing the weight of the second plate, wherein at least one of the one or more magnetic counterbalances comprises a tunable magnetic counterbalance, wherein the tunable magnetic counterbalance comprises:

a first portion including a rod including one or more magnets, the first portion attached to one of the first plate or the second plate; and a second portion including a ferromagnetic sleeve formed from one or more ferromagnetic materials and at least partially surrounding the one or more magnets of the rod, the second portion attached to a different one of the first plate or the second plate than the first portion, wherein the one or more ferromagnetic materials of the ferromagnetic sleeve at least partially surround the one or more magnets in a horizontal plane orthogonal to the vertical direction, wherein the first and second portions are separated by a gap, wherein the counterbalance force is adjustable by controlling at least one of a relative rotation angle between the first and second portions in the horizontal plane or a size of the gap along at least one direction wherein the ferromagnetic sleeve includes a slit configured to weaken magnetic field flow;

a motorized actuator mechanically coupled to at least one of the first portion or the second portion and configured to adjust the relative rotation angle between the first and second portions in the horizontal plane, wherein the actuator is operatively connected to a controller configured to execute program instructions to automatically tune the counterbalance force; and an actuator configured to position the second plate with respect to the first plate along the vertical direction; and an encoder, wherein the encoder is configured to measure a relative position of the second plate and provide feedback to the actuator;

adjusting the counterbalance force to be equal to a combined weight of the second plate and the one or more objects;

generating measurements of at least one of position of the sample along the vertical direction or a distance in the vertical direction between the sample and the at least one of the one or more objects on the second plate; and maintaining, via the actuator, the selected distance in the vertical direction between the sample and the one of one or more objects based on the measurements.

33. The method of claim 32, wherein maintaining, via the actuator, the selected distance in the vertical direction between the sample and the one of one or more objects based on the measurements comprises:

maintaining, via the actuator, the selected distance in the vertical direction between the sample and the one of one or more objects based on the measurements as the sample is translated in the horizontal plane.

* * * * *